United States Patent [19]

Stern et al.

[11] Patent Number: 5,856,434
[45] Date of Patent: Jan. 5, 1999

[54] USE OF POLYMERS CONTAINING ISOLATED CHROMOPHORES AS ELECTROLUMINESCENCE MATERIALS

[75] Inventors: Roland Stern, Wiesbaden; Hermann Schenk, Hofheim; Josef Salbeck, Kelkheim; Thomas Stehlin, Kriftel; Ullrich Scherf, Mainz-Kastel; Klaus Müllen, Mainz, all of Germany; Günther Leising, Graz, Austria

[73] Assignee: Hoechst Aktiengesellschaft, Frankfurt, Germany

[21] Appl. No.: 596,198

[22] PCT Filed: Sep. 1, 1994

[86] PCT No.: PCT/EP94/02899

§ 371 Date: Feb. 16, 1996

§ 102(e) Date: Feb. 16, 1996

[87] PCT Pub. No.: WO95/07955

PCT Pub. Date: Mar. 23, 1995

[30] Foreign Application Priority Data

Sep. 15, 1993 [DE] Germany ............ 43 31 401.5

[51] Int. Cl.⁶ .................................................. C08G 65/22
[52] U.S. Cl. ............... 528/402; 528/401; 526/258; 526/263; 359/245; 313/110
[58] Field of Search ............... 528/125, 86, 401, 528/402; 526/258, 263; 359/245; 313/110

[56] References Cited

U.S. PATENT DOCUMENTS

| | | |
|---|---|---|
| 3,172,862 | 3/1965 | Gurnee et al. |
| 3,621,321 | 11/1971 | Williams ............... 313/108 A |
| 4,672,265 | 6/1987 | Eguchi et al. ............ 313/504 |
| 4,923,288 | 5/1990 | Dhen et al. ............ 350/355 |
| 5,026,147 | 6/1991 | Soane et al. ............ 350/374 |
| 5,155,195 | 10/1992 | Feuer ............ 526/243 |
| 5,204,178 | 4/1993 | Licht et al. ............ 428/333 |

FOREIGN PATENT DOCUMENTS

| | | |
|---|---|---|
| 0 443 861 | 8/1981 | European Pat. Off. . |
| WO 90/13148 | 11/1990 | WIPO . |
| WO 94/15441 | 7/1994 | WIPO . |

OTHER PUBLICATIONS

Friend, R.H., "Optical Investigations of Conjugated Polymers", *J. Mol. Elec.* 4:37–46 (1988).

Sokolik et al., "Blue–Light Electroluminescence from p–phenylene Vinylene–Based Copolymers", *J. Appl. Phys.* 74(5):3584–3586 (1993).

Janssen et al., "Encapsulation of Inorganic Filler Particles by Emulsion Polymerization", pp. 532–533, Eindhoven Univ. of Tech., Dept. of Polymer Chem., PO Box 513, 5600 MB Eindhoven, The Netherlands.

von Seggern et al., "New Polymeric Materials for Blue and Green Light Emitting Diodes", pp. 532–533, Institute for Polymers and Organic Solids and Materials Dept., Univ. of California, Santa Barbara, CA 93106.

*Primary Examiner*—Duc Truong
*Attorney, Agent, or Firm*—Frommer Lawrence & Haug LLP

[57] ABSTRACT

Use in electrooptical switching and display devices of a polymer comprising conjugatively linked chromophore segments whose emission properties are determined by the emission properties of the individual chromophore segments.

Electroluminescence devices comprising the polymers of the present invention have, inter alia, a high color purity. The polymers used according to the present invention enable, in particular, blue and white electroluminescence to also be achieved.

9 Claims, No Drawings

USE OF POLYMERS CONTAINING ISOLATED CHROMOPHORES AS ELECTROLUMINESCENCE MATERIALS

There is a great industrial need for large-area solid state light sources for a series of applications, predominantly in the fields of display elements, VDU technology and lighting engineering. The demands made of these light sources can at present not be achieved completely satisfactorily by any of the existing technologies.

For about 30 years, organic electroluminescence materials and devices have been known in addition to inorganic ones (see, for example, U.S. Pat. No. 3,172,862). However, until recently such devices have been greatly restricted in their practicable usability.

WO 90/13148 and EP-A 0 443 861 describe electroluminescence devices containing a film of a conjugated polymer as light-emitting layer (semiconductor layer). In comparison with those known hitherto, such devices offer numerous advantages, such as the opportunity of producing large-area, flexible displays in a simple and inexpensive manner. In contrast to liquid crystal displays, electroluminescence displays are self-illuminating and therefore require no additional back-lighting source.

A typical device according to WO 90/13148 comprises a light-emitting layer in the form of a thin, dense polymer film (semiconductor layer) containing at least one conjugated polymer. A first contact layer is in contact with a first surface, a second contact layer with a further surface of the semiconductor layer. The polymer film of the semiconductor layer has a sufficiently low concentration of extrinsic charge carriers for charge carriers to be introduced into the semiconductor layer on application of an electric field between the two contact layers, with one contact layer becoming positive in comparison with the other, and the semiconductor layer emitting radiation. The polymers used in such devices are conjugated. A conjugated polymer is a polymer possessing a delocalized $\pi$-electron system along the main chain. The delocalized $\pi$-electron system gives the polymer semiconductor properties and enables it to transport positive and/or negative charge carriers with high mobility. An overview of conjugated polymers is given, for example, in R. H. Friend, J. Mol. Elec. 4 (1988) 37.

In WO 90/13148 and EP-A 0 443 861, the polymeric material used for the light-emitting layer is poly(p-phenylene-vinylene) and it is proposed that the phenyl group in such a material be replaced by a heterocyclic or a condensed carbocyclic ring system.

Although good results were obtained with these materials, the color purity, for example, is still unsatisfactory. Furthermore, it is hardly possible to generate a blue or white emission using the polymers which have hitherto become known.

Polymer Preprints 34 (1993) 532 describes structures in which individual, directly bonded chromophore segments are twisted with respect to one another to achieve a blue shift of the emission. However, according to the authors, it is not possible to produce light-emitting diodes from these materials.

It is an object of the present invention to provide conjugated polymer materials by means of which the above-described disadvantages can be at least partially remedied.

It has now been found that in particular the color purity of the emission of conjugated polymers can be significantly improved if their emission properties are predominantly determined by the emission properties of individual chromophores. This means that the chromophores of these polymers are decoupled in respect of the emission spectra.

The invention accordingly provides for the use in electrooptical switching and display devices of a polymer comprising conjugatively linked chromophore segments and spacer segments whose emission properties are determined by the emission properties of the individual chromophore segments.

Electroluminescence devices comprising such polymers have, inter alia, a high color purity. The polymers used according to the present invention enable, in particular, blue and white electroluminescence to also be achieved.

For the purposes of the invention, conjugation is when at least three $sp^2$-hybridized atoms are directly bonded to one another in a row.

For the purposes of the invention, emission properties are the illumination characteristics of the light-emitting layers in respect of the light intensity, spectral distribution and the light yield, based on the potential applied or the intensity of the incident light.

Determination of the emission properties of the polymer by the emission properties of the chromophore segments means that the emission of the polymer corresponds essentially to that of the isolated chromophores. That is to say, the emission maxima of the polymer and of the isolated chromophore differ from one another by not more than 30 nm.

In the conjugated polymers used according to the present invention and whose emission properties are determined by the emission properties of the individual chromophore segments, individual chromophore and spacer segments are advantageously twisted with respect to one another.

The angle of twist of the individual segments with respect to one another is preferably from 10° to 170°, particularly preferably 30° to 150°, very particularly preferably from 60° to 120°.

For the purposes of the invention, a spacer segment is a group whose absorption is of shorter wavelength than that of the chromophore segment. Since the gap between the highest occupied and the lowest unoccupied molecular orbital (band gap) of the chromophore segment is therefore less than that of the spacer, the emission properties of the polymer are determined by the emission properties of the chromophore segments.

The absorption of the spacer segments is preferably at least 25 nm shorter in wavelength than that of the chromophore segments, particularly preferably from 25 to 100 nm shorter in wavelength.

The chromophore segments preferably have an absorption in the range 300–1150 nm and an emission in the range 380–1200 nm. Particularly preferred chromophore segments are methylene-bridged, planar oligophenylenes or heterocycles.

Very particularly preferred chromophore segments are those of the formulae (Ia) to (In):

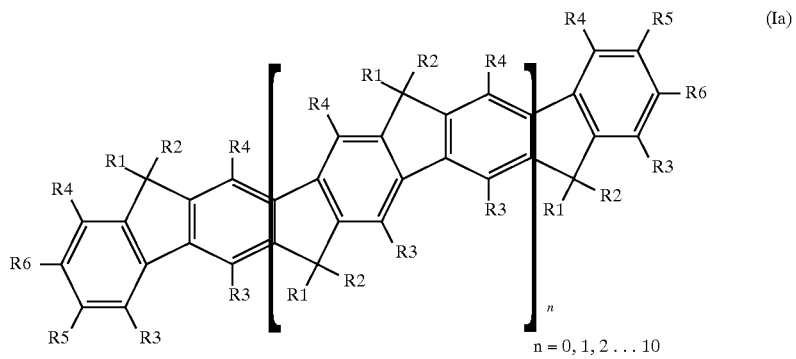 (Ia)
 (Ib)
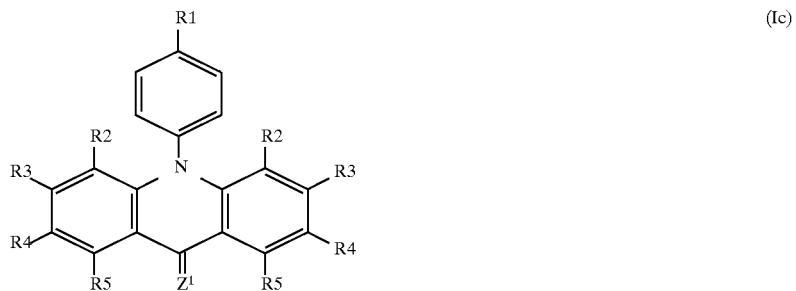 (Ic)
 (Id)
 (Ie)
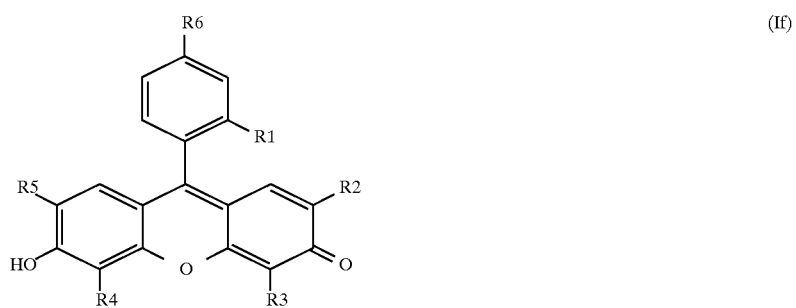 (If)

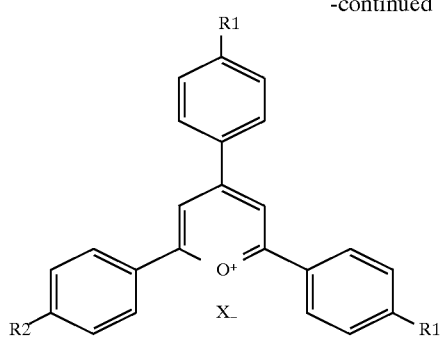
(Ig)
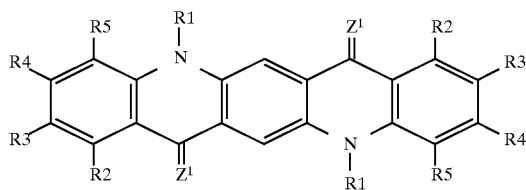
(Ih)
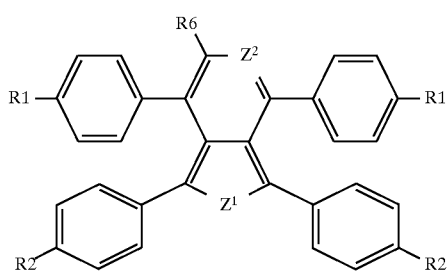
(Ii)
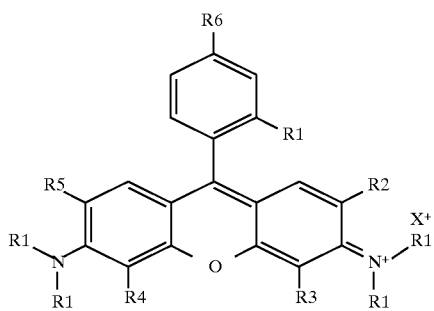
(Ij)
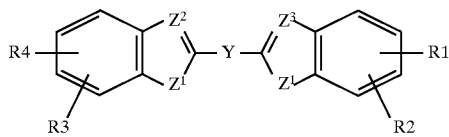
(Ik)
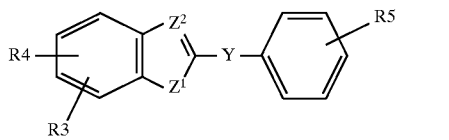
(Il)
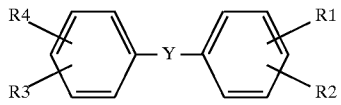
(Im)
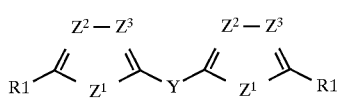
(In)

where:

R$^1$ is H, a straight-chain or branched alkyl group having from 1 to 22 carbon atoms, a C$_6$–C$_{10}$-aryl group or the linkage point to the adjacent spacer segment, with the linkage having to be such that the conjugation is maintained;

R$^2$, R$^3$, R$^4$, R$^5$, R$^6$ are identical or different and are each as defined for R$^1$ or a straight-chain or branched alkoxy group having from 1 to 22 carbon atoms, C$_6$–C$_{10}$-aryloxy, NR$^1{}_2$, NO$_2$, CN;

Z$^1$ is O, S, NR$^1$, CR$^2{}_2$;

Z$^2$, Z$^3$ are CR$^2$, N;

X$^-$ Cl$^\ominus$, Br$^\ominus$, I$^\ominus$, BF$^\ominus{}_4$, PF$^\ominus{}_6$, B(Ph)$_4{}^\ominus$;

Y n is 1, 2, 3, 4, 5.

Preference is given to chromophore segments of the formula (Ia).

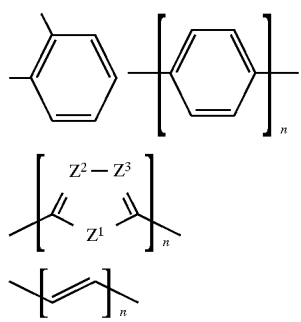

Examples of preferred spacer segments are those of the formulae (IIa) to (IIv):

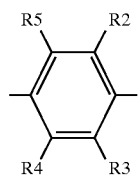 (IIa)

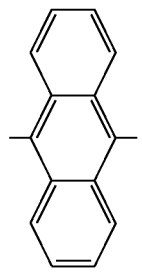 (IIb)

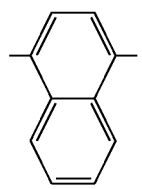 (IIc)

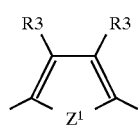 (IId)

-continued

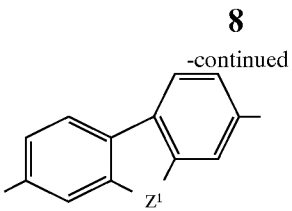 (IIe)

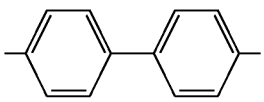 (IIf)

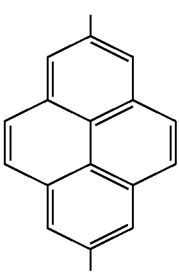 (IIg)

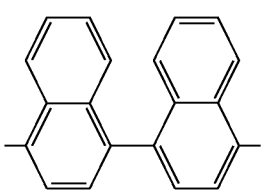 (IIh)

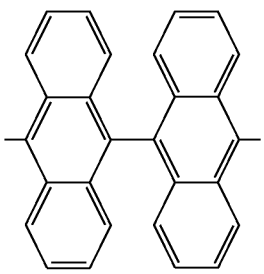 (IIi)

 (IIj)

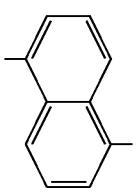 (IIk)

 (IIl)

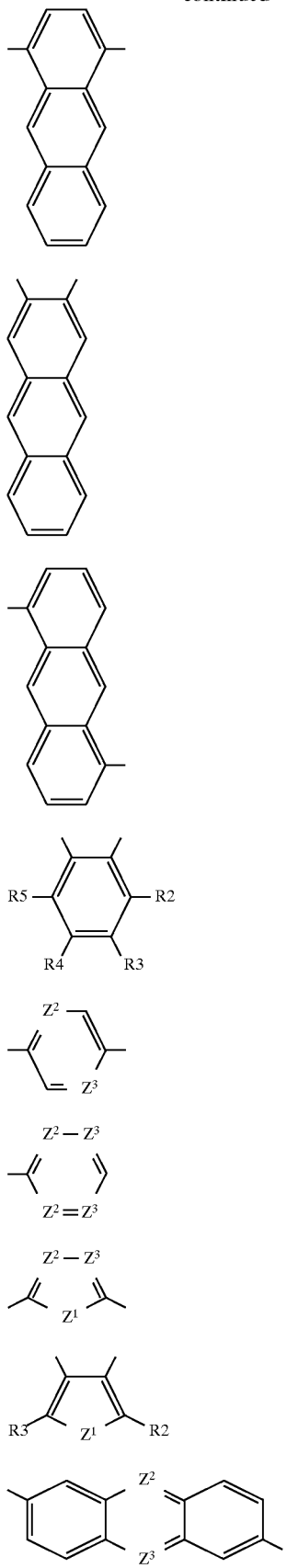

(IIm)

(IIn)

(IIo)

(IIp)

(IIq)

(IIr)

(IIs)

(IIt)

(IIu)

-continued

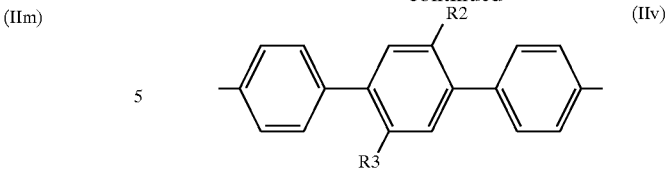

(IIv)

where $Z^1$, $Z^2$, $Z^3$, $R^2$, $R^3$, $R^4$, $R^5$ are as defined for the formula (I).

The polymers used according to the present invention are copolymers comprising one or more chromophore groups and one or more spacer groups. Preference is given to structures in which the chromophore and spacer groups alternate.

The polymers used according to the present invention preferably comprise chromophore segments of the formulae (Ia) to (In) and spacer segments of the formulae (IIa) to (IIv).

Some of the polymers used according to the present invention are known and some are new. The invention therefore also provides a polymer comprising structural units having at least one of the formulae (Ia) to (In) and structural units having at least one of the formulae (IIa) to (IIv). Preference is given to a polymer comprising chromophore segments of the formula (Ia) and spacer segments having at least one of the formulae (IIa) to (IIe). Very particular preference is given to a polymer comprising chromophore segments of the formula (Ia) and spacer segments having at least one of the formulae (IIa) to (IIc).

Polymers used according to the present invention can be prepared primarily by two synthetic routes.

1. The first route comprises the chemical coupling of suitably substituted chromophore segments to give polymers having the structures according to the present invention. In this method the chromophore segments are connected conjugatively by means of suitable spacer segments. By means of the spacer segments used, it is in turn possible to set in a defined manner the angle of twist between the chromophore segments via the selection of the spacer structure. Suitable spacer segments are especially arylenes such as 1,4-phenylene, 2,5-disubstituted 1,4-phenylene, 1,4- and 1,5-naphthylene, 1,4- and 9,10-anthrylene building blocks (as well as the corresponding heteroaromatic analogs), furthermore also monosubstituted or disubstituted vinylene units, with preferred substituents of the arylene and vinylene segments being alkyl, aryl, alkoxy and aryloxy groups. The chemical coupling between the chromophore segments by means of the abovementioned spacer groups is then via functional groups (with —H also being able to act as functional group) which are present on the preformed chromophore and spacer segments. Methods for aryl-aryl and aryl-olefin linkage are used here. Literature methods for this purpose are, inter alia:

transition metal-catalyzed couplings of the HECK type [see, for example, Heck, R. F.; Org. Reactions (1981) 27 345], YAMAMOTO type [see, for example, Yamamoto, T.; Prog. Polym. Sci. 1153], SUZUKI type [see, for example, Miyaura, N., Yanagi, T., Suzuki, A.; Synth. Commun. (1981) 11 513] and STILLE type [see, for example, Stille, J. K.; Angew. Chem. (1986) 98 504, Int. Ed. Engl. (1986) 25 508], and also other well-known coupling methods [see, for example, HOUBEN-WEYL, Methoden der Organischen Chemie, Volume 5/2b "Arene, Arine", Thieme, Stuttgart, 1981].

oxidative aryl-aryl couplings such as the SCHOLL reaction [see, for example, Scholl, R., Seer, C.; Ann. (1912) 394 111] or the oxidative coupling of electron-rich heteroaromatics such as thiophene or pyrrole.

carbonyl-olefination reactions of the WITTIG, HORNER-EMMONS or McMURRY type [see, for example, HOUBEN-WEYL, Methoden der Organischen Chemie, Volume 5/1b "Alkene, Cycloalkene, Arylalkene", Thieme, Stuttgart 1972], or the reductive linking of suitable carbonyl derivatives ($\alpha,\alpha'$-dihalo compounds, thioketones, diazoketones) [see, for example, HOUBEN-WEYL, Methoden der Organischen Chemie, Volume 5/1b "Alkene, Cycloalkene, Aralkene", Thieme, Stuttgart 1972].

2. The second route comprises the synthesis of suitable prepolymers in a first step, followed by polymer-analogous formation of the desired structure according to the present invention. This is achieved by mixing suitable monomers which represent, at least potentially, the future structural constituents (chromophore and spacer segments). The copolymerization (cocondensation) of the aromatic and/or olefinic monomers leads to a copolymer having a random distribution of the monomer building blocks. The coupling of the monomer building blocks is here carried out, for example, by means of the methods listed above for aryl-aryl or aryl-olefin coupling. The target structures are then built up by means of a polymer-analogous reaction step to build up the chromophore segments according to the present invention. Use is here made, in particular, of reactions which lead to bridging of monomer segments present to form highly condensed, planar substructures. This is preferably achieved by intramolecular condensation (cyclization) reactions of the FRIEDEL-CRAFTS type (alkylation, acylation [cf., for example, DE-A 41 11 878], electron-transfer-induced cyclization reactions (reductive and oxidative condensation [cf., for example, U. Scherf, K. Müllen; Synthesis (1992) 23]), various carbonyl-olefination reactions (for example, as indicated above) or by means of photochemical cyclizations (condensations).

The synthesis of a polymer according to the present invention is shown by way of example in Scheme 1.

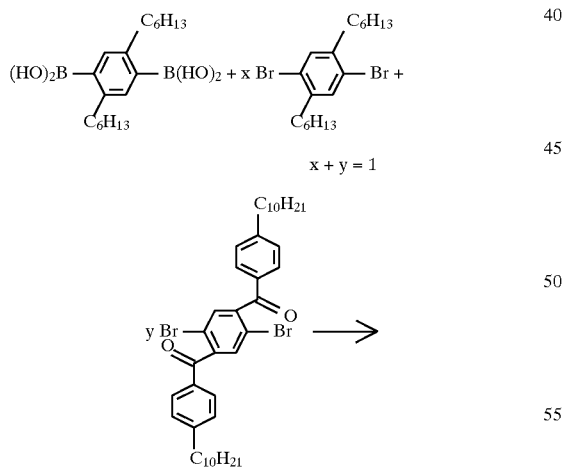

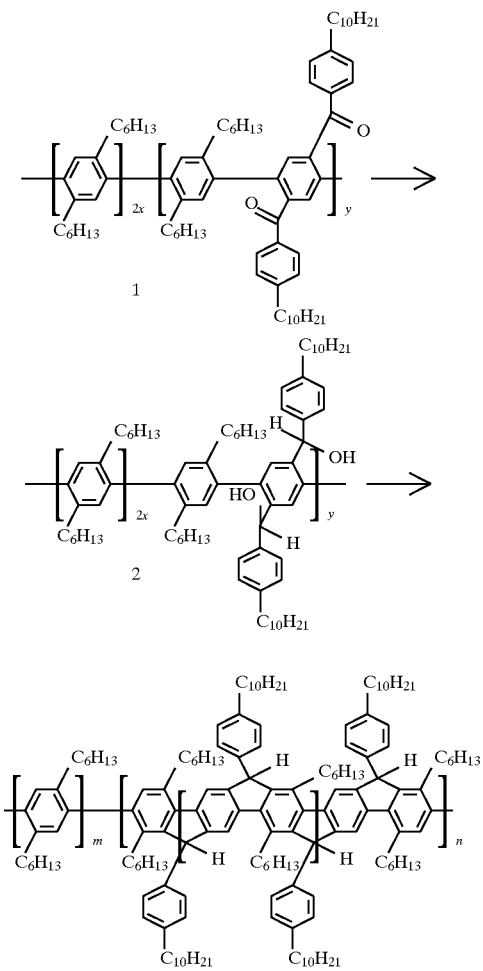

$m = 2x - z \qquad n = \underline{y} + z$

According to the present invention, the polymers mentioned are used in electrical, electronic and electrooptical components. Preference is given to use in electrooptical switching and display devices, in particular those based on electroluminescence. Particular preference is given to use in devices as are described, for example, in WO 90/13148 and EP-A 0 443 861. The invention also provides electrooptical switching and display devices comprising an above-described polymer.

The invention is illustrated by the examples, without being restricted thereto.

EXAMPLES

Example 1

Synthetic procedure for

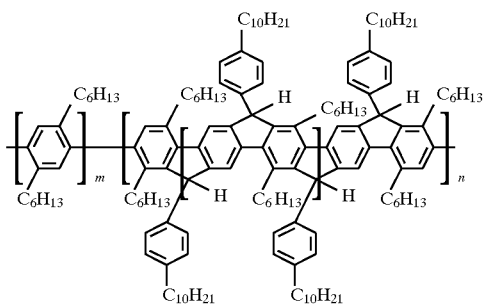

Copolymer having m=0.60 and n=0.40 (see also Scheme 1)

1. 0.363 g of 4,4"-didecyl-2',5'-dibromoterephthalophenone (0.5 mmol), 0.202 g of 2,5-dihexyl-1,4-dibromobenzene (0.5 mmol) and 0.334 g of 2,5-dihexyl- 1,4-phenylenediboronic acid (1 mmol) are dissolved in 5 ml of toluene and are added under inert conditions to 5 ml of 2N aqueous sodium carbonate solution. The mixture is heated to reflux, and 30 mg of tetrakis (triphenylphosphine)palladium-(0) (0.026 mmol) in 5 ml of toluene and 5 ml of n-butanol are then added. After refluxing for 24 hours, the polymer formed is precipitated by pouring into methanol, washed with acid and taken up in a little toluene. Drying of the solution, evaporation and precipitation with acetone give 535 mg (83%) of 1.

2. 200 mg of 1 (0.309 mmol) in 20 ml of toluene are added dropwise to 70 mg of lithium aluminum hydride (1.84 mmol, slurried in 20 ml of THF). After stirring for 30 minutes at room temperature, the mixture is carefully decomposed with 2N hydrochloric acid and washed with water. The organic phase is dried and evaporated to dryness. The polymer 2 is then taken up in a little THF and precipitated in water.

Yield: 167 mg (84%) of 2.

3. 163 mg (0.250 mmol) of 2 are dissolved in 50 ml of methylene chloride and admixed with 100 mg of boron trifluoride etherate (0.700 mmol). After 5 minute, 20 ml of ethanol followed by 50 ml of water are stirred in. The organic phase is carefully washed free of acid, dried and evaporated. Precipitation in acetone gives 138 mg (85%) of 3 as a pale yellow powder having an intense blue fluorescence. The molecular weights determined by means of GPC (using polystyrene as standard, o-dichlorobenzene as solvent) are: $M_n$=8000, $M_w$=15500. The emission spectrum shows two maxima at 454 nm and 480 nm. The width at half height of the total emission is 60 nm (see also FIG. 1).

Example 2

Synthetic procedure for

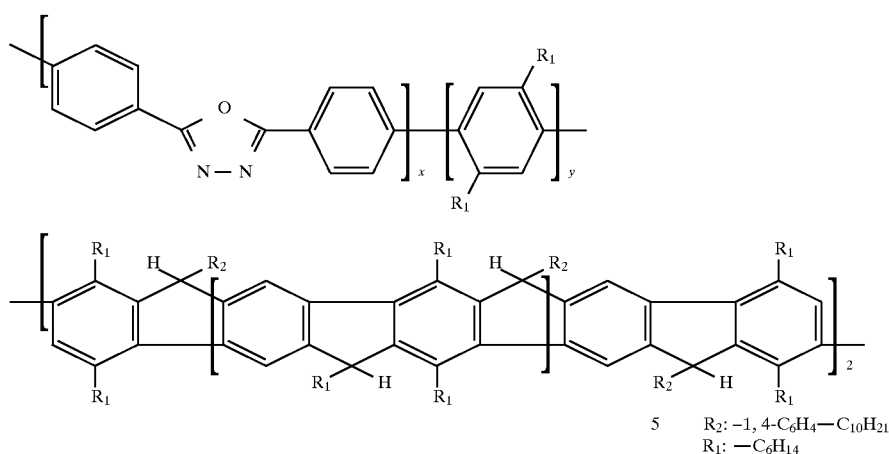

5    $R_2$: –1, 4-$C_6H_4$—$C_{10}H_{21}$
     $R_1$: —$C_6H_{14}$ 0.290 g of 4,4"-dodecyl-2',5'-dibromoterephthalophenone (0.4 mmol), 0.121 g of 2,5-dihexyl-1,4-dibromobenzene (0.3 mmol), 97.5 mg of 3,6-dibromocarbazole (0.3 mmol) and 0.334 g of 2,5-dihexyl-1,4-phenylenediboronic acid (1 mmol) are reacted by a method similar to Example 1 (reaction steps 1 to 3).

Yield after the 3rd step: 303 mg of copolymer 4; $M_n$: 4100; $M_w$: 6200 (GPC in 1,2-dichlorobenzene, calibration using polystyrene (PS) standards) as yellowish powder.

Example 3
Synthetic procedure for

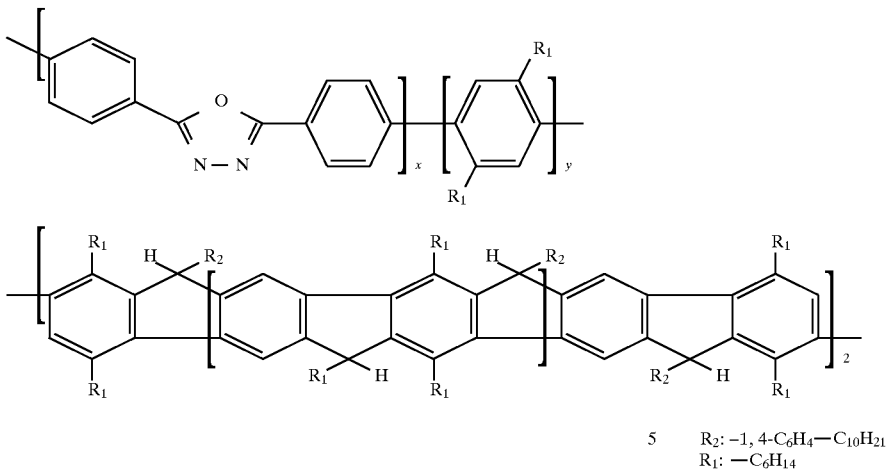

0.290 g of 4,4''-dodecyl-2',5'-dibromoterephthalophenone (0.4 mmol), 0.121 g of 2,5-dihexyl-1,4-dibromobenzene (0.3 mmol), 0.114 g of 2,5-bis(4-bromophenyl)-1,3,4-oxadiazole (0.3 mmol) and 0.334 g of 2,5-dihexyl-1,4-phenylenediboronic acid (1 mmol) are reacted by a method similar to Example 1 (reaction steps 1 to 3).

Yield after the 3rd step: 372 mg of copolymer 5; $M_n$: 18000; $M_w$: 31000 (GPC in 1,2-dichlorobenzene, calibration using PS standards) as slightly pale yellow powder.

Example 4
Electroluminescence device comprising 60/40 copolymer 3 from Example 1 as electroluminescence layer The copolymer 3 synthesized as described in Example 1 is dissolved in chloroform (30 mg/ml) and applied by means of spin coating (1000–3000 rpm) to a glass support partially coated with electrically conductive indium/tin oxide (ITO), with a homogeneous transparent film having a thickness of 150–250 nm (measured using a DekTak-II layer thickness measuring apparatus) being formed. A second electrode of calcium is applied to this film by vacuum vapor deposition. On application of an electric potential between the ITO electrode and the metal electrode, with the metal electrode having a negative potential compared with the ITO electrode, pale blue electroluminescence is observed. The emitting area of the electroluminescence device is 5 mm² and is defined by the overlapping of the ITO electrode and the calcium electrode. The intensity of the electroluminescence increases linearly with the current and the internal quantum efficiency is constant at current densities above 0.8 mA/cm². All processing steps and measurements are carried out under inert conditions. The internal quantum efficiency of the electroluminescence is calculated taking into account corrections for the emission characteristics, the orifice angle of the detector, the scattered light and the losses in the substrate.

We claim:

1. An electrooptical switching and display device comprising a polymer comprising conjugatively linked chromophore and spacer segments, where the absorption of the spacer segments is at least 25 nm shorter in wavelength than that of the chromophore segments and the emission properties of the polymer and its emission properties are determined by the emission properties of the individual chromophore segments.

2. The device as claimed in claim 1, wherein individual segments of the polymer are twisted in an angle with respect to one another.

3. The device as claimed in claim 2, wherein the angle of twist is from 10° to 170°.

4. The device as claimed in claim 1, wherein the polymer has alternating chromophore and spacer groups.

5. The device as claimed in claim 1 wherein the polymer comprises chromophore segments having at least one of the formulae (Ia) to (In):

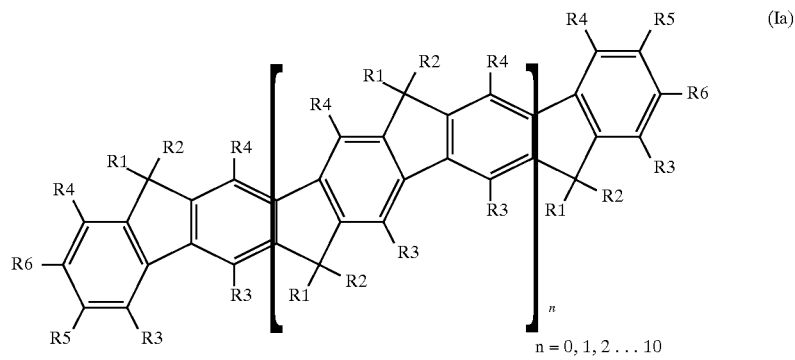

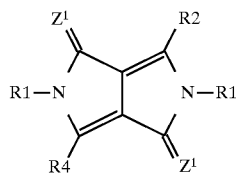 (Ib)
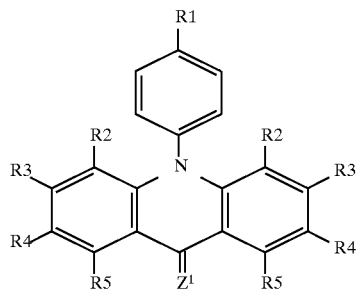 (Ic)
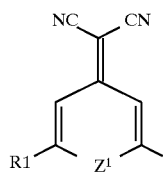 (Id)
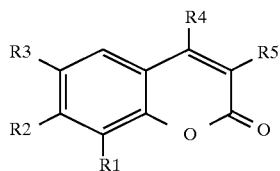 (Ie)
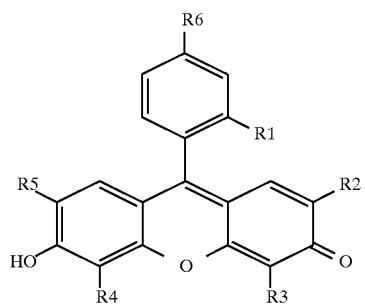 (If)
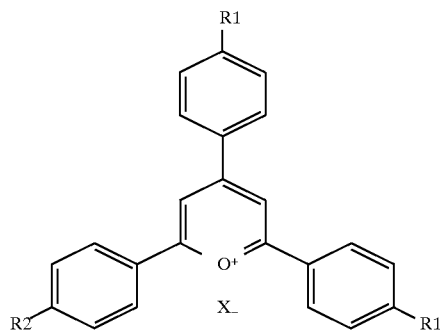 (Ig)

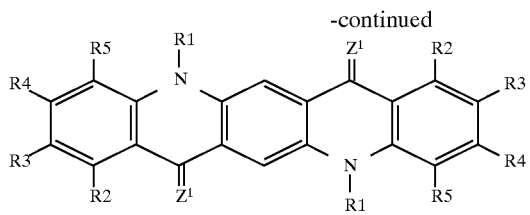 (Ih)

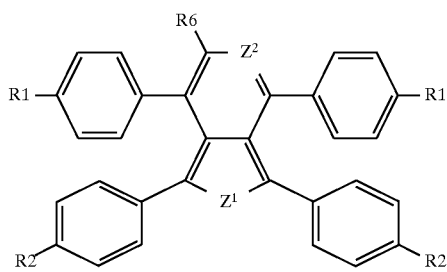 (Ii)

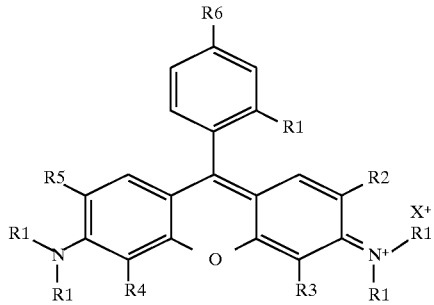 (Ij)

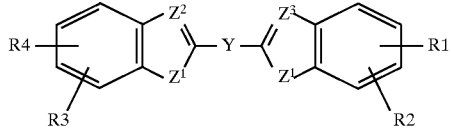 (Ik)

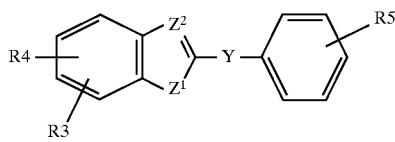 (Il)

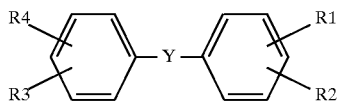 (Im)

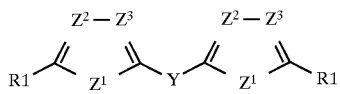 (In)

where:
- $R^1$ a straight-chain or branched alkyl group having from 1 to 22 carbon atoms, a $C_6$–$C_{10}$-aryl group or the linkage point to the adjacent spacer segment, with the linkage having to be such that the conjugation is maintained;
- $R^2$, $R^3$, $R^4$, $R^5$, $R^6$ are identical or different and are each as defined for $R^1$ or a straight-chain or branched alkoxy group having from 1 to 22 carbon atoms, $C_6$–$C_{10}$-aryloxy, $NR^1_2$, $NO_2$, CN;
- $Z^1$ is O, S, $NR^1$, $CR^2_2$;
- $Z^2$, $Z^3$ are $CR^2$, N;
- $X^-$ $Cl^\ominus$, $Br^\ominus$, $I^\ominus$, $BF^\ominus_4$, $PF^\ominus_6$, $B(Ph)_4^\ominus$;
- Y n is 1, 2, 3, 4, 5.

6. The device as claimed in claim 1 wherein the polymer comprises spacer segments having at least one of the formulae (IIa) to (IIv):

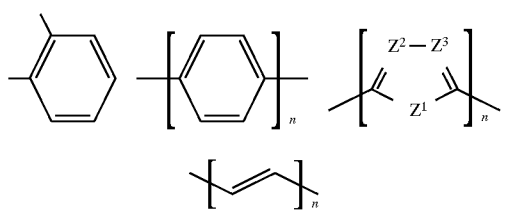

-continued
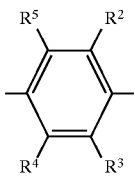 (IIa)
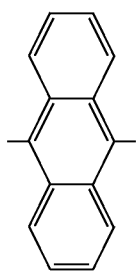 (IIb)
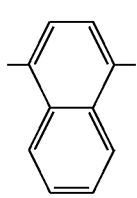 (IIc)
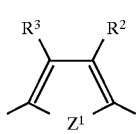 (IId)
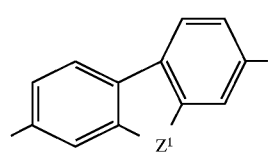 (IIe)
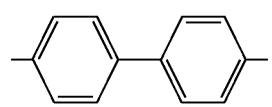 (IIf)
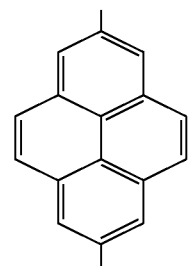 (IIg)
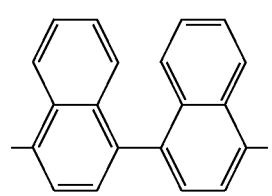 (IIh)
-continued
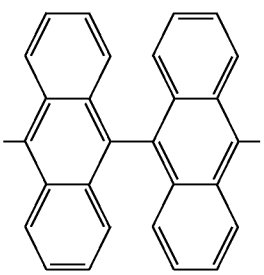 (IIi)
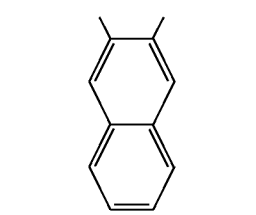 (IIj)
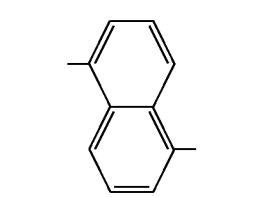 (IIk)
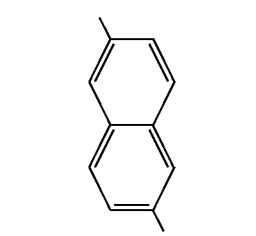 (IIl)
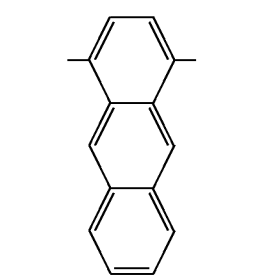 (IIm)
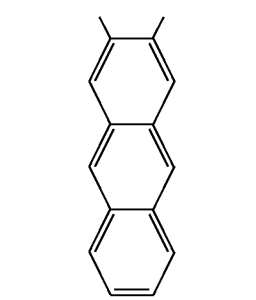 (IIn)

-continued

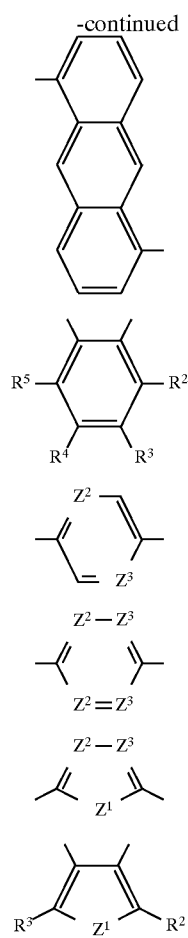
(IIo) 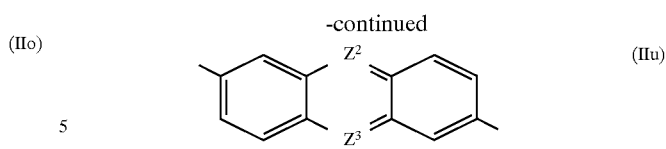
(IIp)
(IIq)
(IIr)
(IIs)
(IIt)

-continued (IIu) 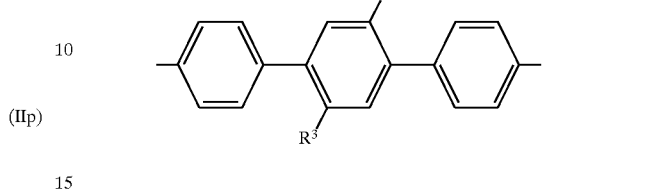

(IIv)

where the symbols $Z^1$, $Z^2$, $Z^3$, $R^2$, $R^3$, $R^4$, $R^5$ are as defined for formula (I) in claim 7.

7. A polymer comprising structural units having at least one of the formulae (Ia) to (In) in claim 5 and structural units having at least one of the formulae (IIa) to (IIv) in claim 6.

8. A polymer comprising chromophore segments of the formula (Ia) in claim 5 and spacer segments having at least one of the formulae (IIa) to (IIe) in claim 6.

9. A polymer comprising chromophore segments of the formula (Ia) in claim 5 and spacer segments having at least one of the formulae (IIa) to (IIc) in claim 6.

* * * * *